United States Patent
Song

(10) Patent No.: US 7,151,699 B2
(45) Date of Patent: *Dec. 19, 2006

(54) SEMICONDUCTOR MEMORY DEVICE

(75) Inventor: Seong-Hwi Song, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 179 days.

This patent is subject to a terminal disclaimer.

(21) Appl. No.: 10/879,769

(22) Filed: Jun. 28, 2004

(65) Prior Publication Data

US 2005/0117434 A1 Jun. 2, 2005

(30) Foreign Application Priority Data

Dec. 1, 2003 (KR) .................... 10-2003-0086265

(51) Int. Cl.
*G11C 7/10* (2006.01)
*G11C 8/00* (2006.01)
(52) U.S. Cl. .............................. 365/189.02; 365/230.02
(58) Field of Classification Search ........... 365/189.02, 365/189.05, 230.02, 230.03, 230.06, 230.08
See application file for complete search history.

(56) References Cited

U.S. PATENT DOCUMENTS

| 5,504,875 | A  | * | 4/1996 | Mills et al. ............ 365/189.02 |
| 6,091,667 | A  | * | 7/2000 | Tanaka et al. ......... 365/230.02 |
| 6,687,174 | B1 | * | 2/2004 | Maruyama et al. .... 365/189.05 |
| 6,920,068 | B1 | * | 7/2005 | Ku ........................ 365/189.02 |

* cited by examiner

*Primary Examiner*—Trong Phan
(74) *Attorney, Agent, or Firm*—Blakely Sokoloff Taylor & Zafman

(57) ABSTRACT

Provided is a semiconductor memory device, which is capable of further simplifying the data multiplexing structure on a data write path, thereby preventing a timing mismatch in data input from being occurred. The semiconductor memory device, which comprises a data inputting block 30 for transferring data applied to a plurality of data input/output pins DQ0 to DQ15 to a plurality of global I/O buses gio<0:15>, a data multiplexing block 32 for multiplexing the data carried on the plurality of global I/O buses gio<0:15> according to a data width option, and a main write driver 34, in response to a control signal, for driving the data outputted from the multiplexing means to a memory core region.

7 Claims, 4 Drawing Sheets

SEMICONDUCTOR MEMORY DEVICE

FIELD OF INVENTION

The present invention relates to a design technique for a semiconductor memory device; and, more particularly, to a data write path of the semiconductor memory device.

DESCRIPTION OF PRIOR ART

Typically, a data bus, which transfers data inputted thereto via data input/output pins (DQ) to a memory cell array, is referred to as a global I/O bus (GIO). Included within the memory cell array is a hierarchical I/O bus structure for transferring data between each bit line and the global I/O bus.

Meanwhile, a write driver is used to drive data carried on the global I/O bus to the I/O bus within the memory cell array, and an I/O sense amplifier (IOSA) is used to transfer the data carried on the I/O bus within the memory cell array to the global I/O bus.

In addition, a data input buffer, a data multiplexer, a data input driver and the like are disposed at a region of peripheral circuitry to constitute a data write path of the semiconductor memory device. In case of a semiconductor memory device such as DDR SDRAM, 16 data input/output pins (DQ) and 16 global I/O buses (GIO) are provided to support X4, X8, and X16 data width options. Accordingly, when the X16 mode is selected, the data transmission is performed through each of the data input/output pins (DQ) and each of the global I/O buses (GIO) corresponding thereto. However, when the ×4 mode or the ×8 mode is selected, a multiplexing process is required to transfer data inputted thereto via the data input/output pins (DQ) to a particular global I/O bus(GIO), since the data input/output pins (DQ) and the global I/O buses (GIO) does not correspond each other by one-to-one. Such function is performed by the data multiplexer (an ×4 data multiplexer and an ×8 data multiplexer).

FIG. 1 is a circuit diagram of the ×4 data multiplexer according to the prior art.

Referring to FIG. 1, the ×4 data multiplexer 10 of the prior art includes 4 pass gates PG1, PG2, PG3 and PG4 which selectively transfer input data din<0:3> to a global I/O bus gio<0>, in response to a control signal gayBD<0:3>.

Meanwhile, a plurality of the ×4 data multiplexers 10 is required to support the ×4 mode, each having the same configuration. Similarly, a plurality of the ×8 data multiplexers is required to support the ×8 mode.

FIG. 2 is a block diagram which illustrating the data write path according to the prior art.

Referring to FIG. 2, the data write path of the prior art includes: a data input block 20, which has a plurality of data input/output pins DQ0 to DQ15, a plurality of ×4 data multiplexers MUX ×4, and a plurality of ×8 data multiplexers MUX ×8, for transferring data applied thereto via the plurality of data input/output pins DQ0 to DQ15, to the global I/O buses gio<0:15>; and a main write driving block 25, which has a plurality of write drivers wd0 to wd15, for driving data carried on the global I/O buses gio<0:15> to the memory cell array, respectively.

In practice, although it is omitted in FIG. 2, the data input block 20 includes a data input buffer for buffering the data applied to the data input/output pins DQ0 to DQ15, and a data input driver for driving the global I/O buses gio<0:15> with the output signal of the data multiplexers MUX ×4 and MUX ×8.

As demonstrated above, the data write path of the prior art includes the plurality of data multiplexers for supporting the data width option for the data input block 20 disposed at the region of the peripheral circuitry. As can be seen from FIG. 1, the prior art suffers from the disadvantage that the data multiplexers MUX ×4 and MUX ×8 are intricately connected with the data input/output pins DQ0 to DQ15, resulting in greater layout area requirements.

Meanwhile, since several addresses should be inputted to control the data multiplexers MUX X4 and MUX X8 in synchronism with a data input timing, the prior art suffers from the disadvantage that the probability of occurrence of a timing mismatch in data input increases.

SUMMARY OF INVENTION

It is, therefore, a primary object of the present invention to provide a semiconductor memory device, which is capable of further simplifying the data multiplexing structure on a data write path, thereby preventing a timing mismatch in data input from being occurred.

In accordance with a preferred embodiment of the present invention, there is provided to a semiconductor memory device, which comprises: a data inputting means for transferring data applied to a plurality of data input/output pins to a plurality of data buses; a data multiplexing means for multiplexing the data carried on the plurality of data buses according to a data width option; and a write driving means, in response to a control signal, for driving the data outputted from the multiplexing means to a memory core region.

In the present invention, a scheme is employed, which disposes a data multiplexing structure for the data width option at the side of a main write driver. Specifically, the scheme is not multiplexing data applied to the data input/output pins (DQ) but multiplexing data carried on the global I/O buses (GIO). In this case, the total number of the multiplexers is decreased, and input to the multiplexers is simplified, thereby resulting in a dramatically reduced layout area and preventing a timing mismatch in data input from being occurred.

BRIEF DESCRIPTION OF DRAWINGS

The above and other objects and features of the present invention will become apparent from the following description of preferred embodiments given in conjunction with the accompanying drawings, in which.

DETAILED DESCRIPTION OF THE INVENTION

Figure 1:
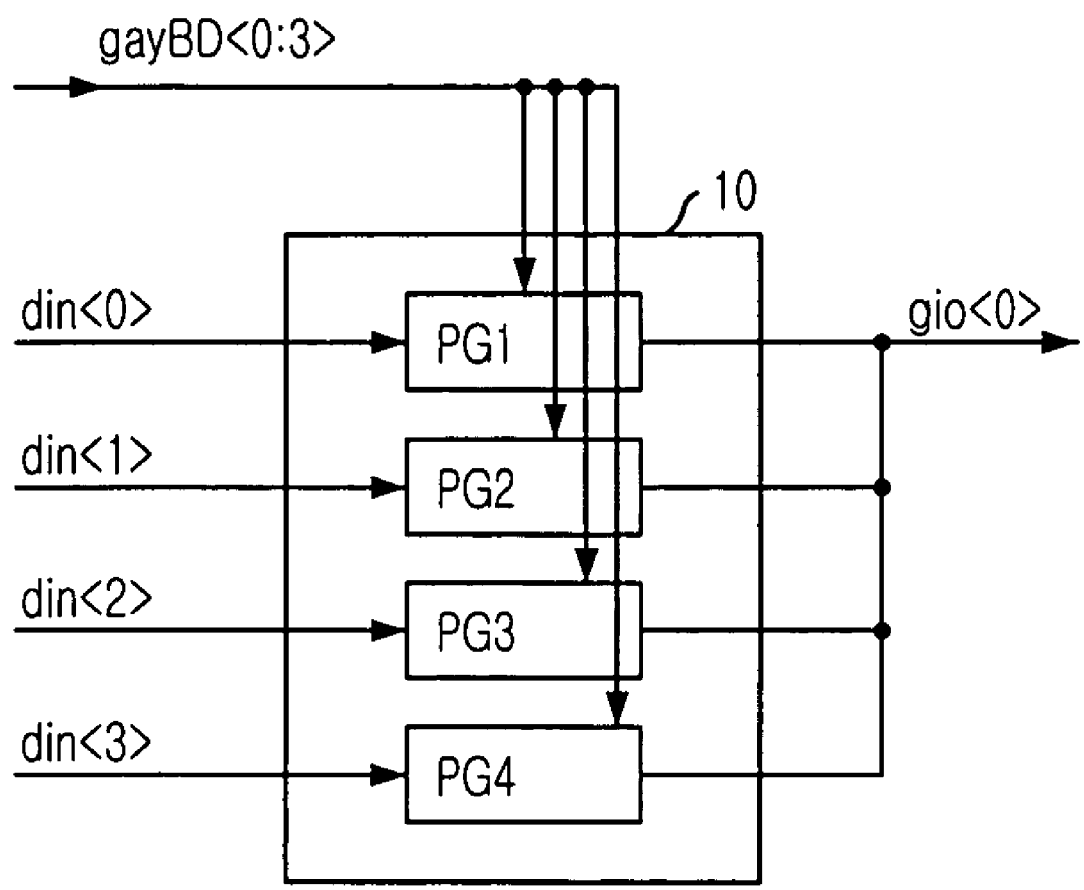
FIG. 1 is a circuit diagram of the ×4 data multiplexer according to the prior art.
Figure 2:
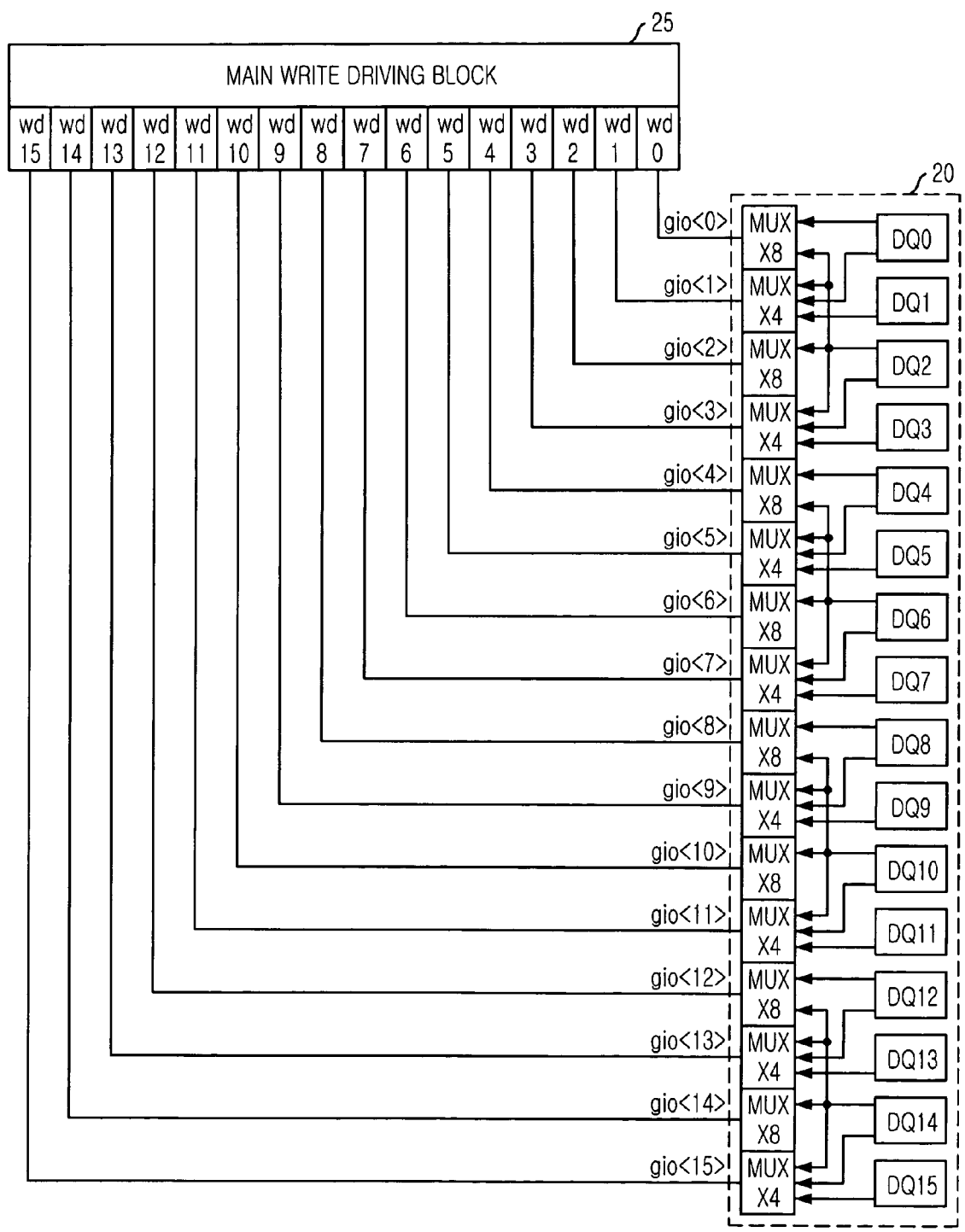
FIG. 2 is a block diagram which illustrating the data write path according to the prior art.
Figure 3:
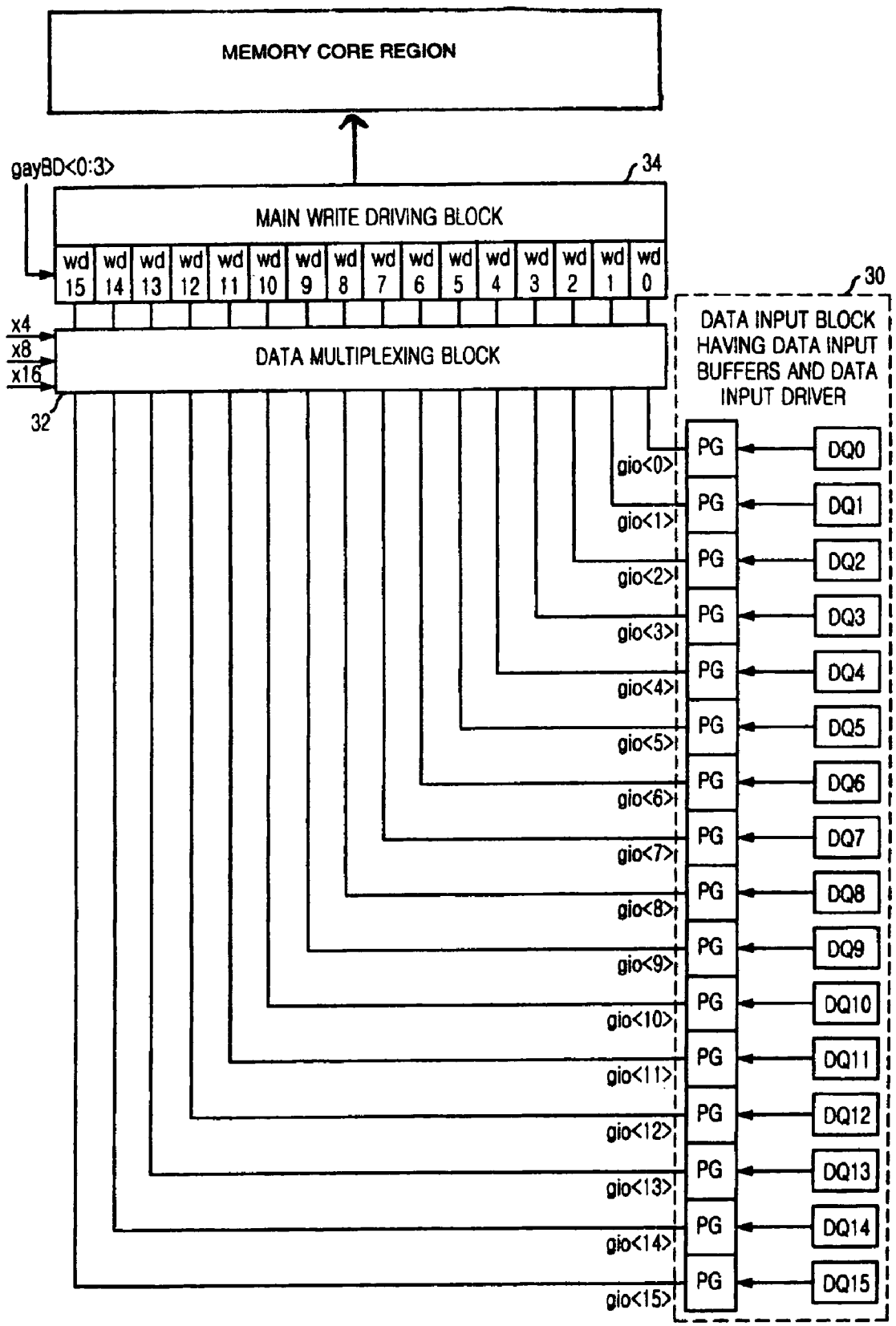
FIG. 3 is a block diagram of a data write path in accordance with a preferred embodiment of the present invention.

Hereinafter, a semiconductor memory device according to the present invention will be described in detail referring to the accompanying drawings FIG. 3 is a block diagram of a data write path in accordance with a preferred embodiment of the present invention.

Referring to FIG. 3, the data write path in accordance with a preferred embodiment of the present invention comprises: a data input block 30 for transferring data applied to data input/output pins DQ0 to DQ15 to global I/O buses gio<0:15>; a data multiplexing block 32 for multiplexing data carried on the global I/O buses gio<0:15> according to data width options ×4, ×8 and ×16; and a main write driving block 34 for driving data outputted from the data multiplexing block 32 to a memory cell array (memory core region) in response to a control signal gayBD<0:3>.

Herein, the data input block 30 includes the plurality of data input/output pins DQ0 to DQ15, a plurality of data input buffers (not shown) for buffering the data applied to the data input/output pins DQ0 to DQ15, and a plurality of pass gates PGs having the output of each of the data input buffers as its input, and a data input driver (not shown) for driving the global I/O buses gio<0:15> with the output of each of the plurality of pass gates PGs.

Figure 4:
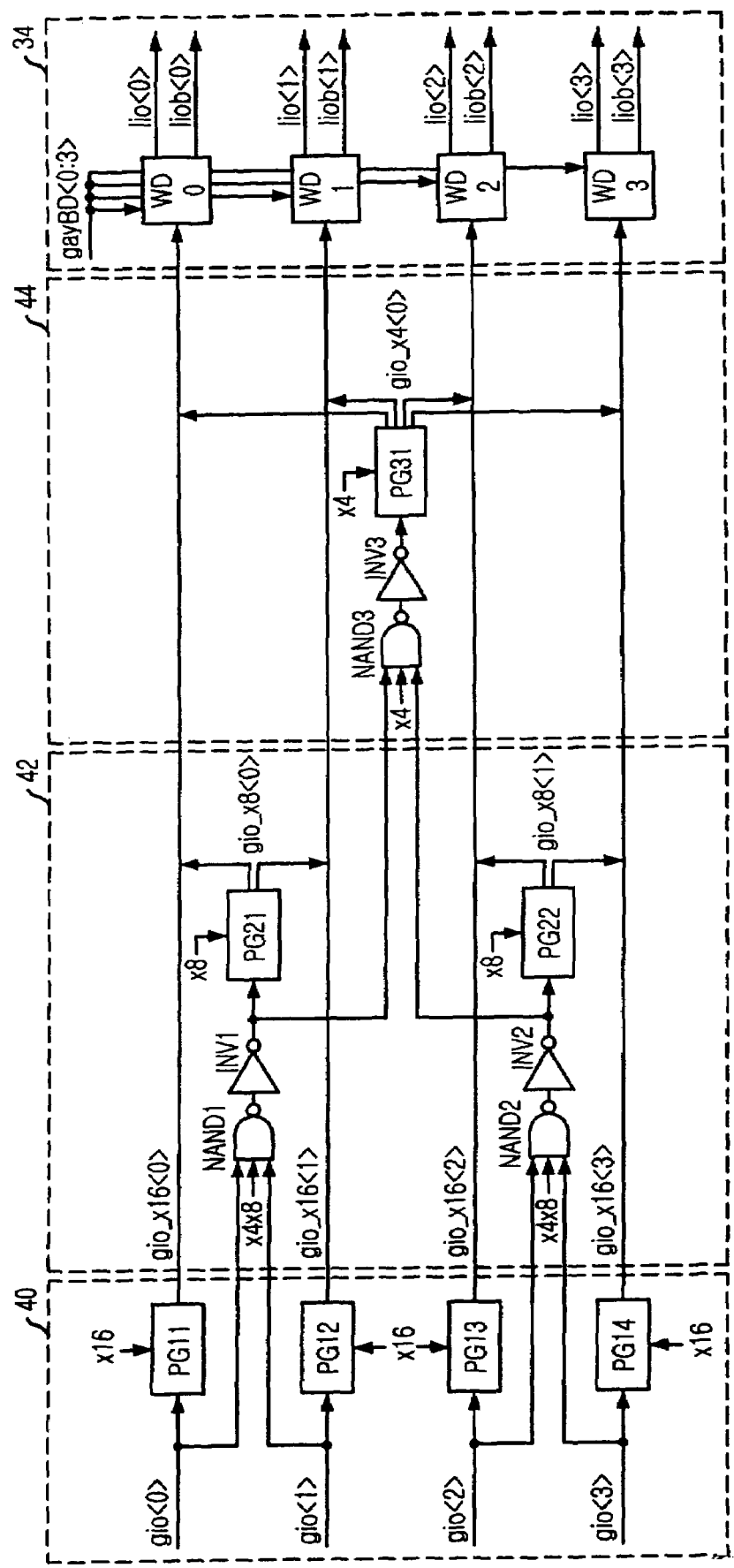
FIG. 4 is a circuit diagram illustrating a portion of the configuration of the data multiplexing block and the main write driving block 34 shown in FIG. 3.

FIG. 4 is a circuit diagram illustrating a portion of the configuration of the data multiplexing block 32 and the main write driving block 34 shown in FIG. 3.

Referring to FIG. 4, the data multiplexing block 32 includes: an ×16 selecting block 40 for selectively outputting the data carried on the global I/O buses gio<0:15> in response to an ×16 option selection signal ×16; an ×8 selecting block 42 for selectively outputting 8 of the data carried on the global I/O buses gio<0:15> in response to an ×4/×8 option selection signal ×4/×8 and ×8 option selection signal ×8; and an ×4 selecting block 44 for selectively outputting 4 of the data outputted from the ×8 selecting block 42 in response to the ×4 option selection signal ×4.

In FIG. 4, only the multiplexing structure corresponding to 4 global I/O buses gio<0:3> is shown, thus required are 4 circuits with the same configuration as the circuit shown in FIG. 4. A detailed description will be made as to a circuit configuration of ¼ circuit as shown in FIG. 4, e.g., the data multiplexing block 32.

First, the ×16 selecting block 40 includes 4 pass gates PG11, PG12, PG13 and PG14 for selectively passing the data carried on each of the global I/O buses gio<0:3>, under the control of the ×16 option selection signal ×16 which is activated upon the selection of the ×16 data width option.

Next, the ×8 selecting block 42 includes: a NAND gate NAND1 having the ×4/×8 option selection signal ×4/×8 which is activated upon the selection of the ×4 or ×8 option selection signals, and the data carried on the global I/O buses gio<0> and gio<1> as its input; an inverter INV1 having the output of the NAND gate NAND1 as its input; a pass gate PG21 for selectively passing the output signal of the inverter INV1 in response to the ×8 option selection signal ×8 which is activated upon the selection of the ×8 data width option; a NAND gate NAND2 having the ×4/×8 option selection signal ×4/×8 and the data carried on the global I/O buses gio<2> and gio<3> as its input; and a pass gate PG22 for selectively passing the output signal of the inverter INV2 in response to the ×8 option selection signal ×8.

Next, the ×4 selecting block 44 includes: a NAND gate NAND3 having the ×4 option selection signal ×4 which is activated upon the selection of the ×4 data width option and the output signals of the inverters INV1 and INV2, as its input; an inverter INV3 having the output of the NAND gate NAND3 as its input; and a pass gate PG31 for selectively passing the output signal of the inverter INV3 in response to the ×4 option selection signal ×4.

Meanwhile, the main write driving block 34 includes 4 write drivers WD0, WD1, WD2 and WD3, which drives the output signal of the data multiplexing block 32 in response to the control signal gayBD<0:3> to local buses lio<0:3>, liob<0:3> within the memory cell array, wherein the output signal is one of the output signals gio__×16<0:3> of the ×16 selecting block 40, the output signals gio__×8<0:1> of the ×8 selecting block 42, and the output signal gio__×16<0> of the ×4 selecting block 44.

Note that the configuration of the data multiplexing block 32 and the main write driving block 34 described above corresponds to that of 4 global I/O buses gio<0:3> of the 16 global I/O buses gio<0:15>, three circuits with the same configuration as the circuit shown in FIG. 4 are required.

A detailed description will be made as to the operation of the data write path in accordance with the present invention with reference to FIGS. 3 and 4.

First, referring to FIG. 3, the data applied to the data input/output pins DQ0 to DQ15 is carried on the global I/O buses gio<0:15> corresponding to each of the data input/output pins DQ0 to DQ15 irrespective of the data width option, since separate multiplexing structure is not provided to the data input block 30.

Meanwhile, referring to FIG. 4, each of the pass gates PG11, PG12, PG13 and PG14 of the ×16 selecting block 40 in the data multiplexing block 32 passes the data carried on the global I/O buses gio<0:3> upon the selection of the ×16 data width option, and blocks the data upon the selection of the ×4 or ×8 data width options. In this case, the write drivers WD0, WD1, WD2 and WD3 in the main write driving block 34 receive the data gio__×16<0:3> outputted from the ×16 selecting block 40 respectively, and are enabled by the control signal gayBD<0:3>, thereby allowing the input data to be driven to the local I/O buses lio<0:3> and liob<0:3> within the memory cell array, respectively.

Subsequently, upon the selection of the ×8 data width option, the ×8 selecting block 42 passes data carried on one corresponding to the data input/output pins to which external data is applied, among a pair of global I/O buses gio<0:1> and gio<2:3>. In this case, the other corresponding to the data input/output pins being not in use at the ×8 data width option holds in a high logic level. The pair of write drivers WD0, WD1, WD2 and WD3 in the main write driving block 34 receives the data gio__×8<0> and gio__×8<1> outputted from the ×16 selecting block 40 and is enabled one at a time in response to the control signal gayBD<0:3>, thereby allowing the input data to be driven to a corresponding local I/O bus.

Subsequently, upon the selection of the ×4 data width option, the ×4 selecting block 44 passes data carried on one corresponding to a data input/output pin to which external data is applied, among 4 global I/O buses gio<0:3>. Even upon the selection of the ×4 data width option, the ×4/×8 option selection signal ×4×8 is activated. As a result, the ×4 selecting block 44 is capable of receiving data provided at the front of the pass gates PG21 and PG22 of the ×8 selecting block 42. In this case, the other corresponding to the data input/output pin being not in use at the ×8 data width option holds in a high logic level. The 4 write drivers WD0, WD1, WD2 and WD3 in the main write driving block 34 receive the data gio__×4<0> outputted from the ×4 selecting block 44 and are enabled one at a time in response to the control signal gayBD<0:3>, thereby allowing the input data to be driven to a corresponding local I/O bus.

In the overall circuit, when the ×16 data width option is selected, 16 local I/O buses are driven; when the ×8 data width option is selected, a total of 8 local I/O buses as once per two local I/O buses are driven; and when the ×4 data width option is selected, a total of 4 local I/O buses as once per four local I/O buses are driven.

As can be seen from the foregoing descriptions, the present invention employs the scheme which disposes the data multiplexing structure for the data width option at the side of the main write driver.

As mentioned above, if used is the scheme which is not multiplexing the data applied to the data input/output pins DQ but multiplexing the data carried on the global I/O buses GIO, the input structure of the multiplexer is simplified, which in turn results in a simplified circuit, thereby leading a dramatically reduced layout area. Further, the input of a plurality of addresses for multiplexing control to the write driver ensure a timing margin between the data inputs, thereby preventing a timing mismatch in data input from being occurred.

For example, in the abovementioned embodiments, even though there is illustratively described with respect to the semiconductor memory device supporting ×16/×8/×4 data width options, the present invention may be applied to the case that the semiconductor memory device further supports an ×32 data width option. In this case, one stage is added to the data multiplexing block.

Therefore, the present invention simplifies the multiplexing structure on a data write path to reduce a layout area and prevents a timing mismatch in data input from being occurred, which, in turn, improves reliability of the semiconductor memory device.

The present application contains subject matter related to Korean patent application No. 2003-86265, filed in the Korean Patent Office on Dec. 1, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device, which comprises:
a data inputting means for transferring data applied to a plurality of data input/output pins to a plurality of data buses;
a data multiplexing means for multiplexing the data carried on the plurality of data buses according to a data width option; and
a write driving means, in response to a control signal, for driving the data outputted from the multiplexing means to a memory core region.

2. The semiconductor memory device of claim 1, wherein the data multiplexing means includes:
an X16 selecting block for selectively outputting the data carried on the data buses in response to an X16 option selection signal X16;
an X8 selecting block for selectively outputting eight of the data carried on the data buses in response to an X4/X8 option selection signal X4/X8 and an X8 option selection signal X8; and
an ×4 selecting block for selectively outputting four of the 8 data outputted from the X8 selecting block, in response to the ×4 option selection signal X4.

3. The semiconductor memory device of claim 1, wherein the data inputting means includes:
a plurality of data input/output pins;
a plurality of data input buffers for buffering data applied to the plurality of data input/output pins; and
a plurality of pass gates having output of each of the plurality of data input buffers as its input; and
a data input driver for driving the plurality of data buses with output of each of the plurality of pass gates.

4. The semiconductor memory device of claim 1, wherein each of the write driving means includes a plurality of write drivers for driving the output signal of the data multiplexing means to a bus in the memory core region, in response to the control signal.

5. The semiconductor memory device of claim 2, wherein the ×16 selecting block includes first to sixteen pass gates for selectively passing therethrough the data carried on each of the data buses, in response to the ×16 option selection signal ×16.

6. The semiconductor memory device of claim 5, wherein the ×8 selecting block includes:
1st to 8th NAND gates having the ×4/×8 option selection signal and the data carried on different pairs of the data buses as its input, respectively;
1st to 8th inverters having the output signals of the 1st to 8th NAND gates as its input, respectively; and
17th to 24th pass gates having the output signals of the 1st to 8th inverters as its input respectively, and is controlled by the ×8 option selection signal.

7. The semiconductor memory device of claim 6, wherein the ×4 selecting block includes:
9th to 12th NAND gates having the ×4 option selection signal ×4 and the output signal of different pairs of the 1st to 8th inverters as its input, respectively;
9th to 12th inverters having the output signals of the 9th to 12th NAND gates as its input, respectively; and
25th to 28th pass gates having the output signals of the 9th to 12th inverters as its input respectively, and is controlled by the ×4 option selection signal ×4.

* * * * *